United States Patent [19]
Narita

[11] Patent Number: 5,917,247
[45] Date of Patent: *Jun. 29, 1999

[54] STATIC TYPE MEMORY CELL STRUCTURE WITH PARASITIC CAPACITOR

[75] Inventor: Yoshitaka Narita, Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/623,531

[22] Filed: Mar. 29, 1996

[30] Foreign Application Priority Data

Mar. 31, 1995 [JP] Japan .................................. 7-075104

[51] Int. Cl.⁶ ..................................................... H01L 27/11
[52] U.S. Cl. ......................... 257/903; 257/904; 257/532; 257/534
[58] Field of Search .................................. 257/903, 904, 257/653, 659, 532, 534, 303

[56] References Cited

U.S. PATENT DOCUMENTS

| 4,894,696 | 1/1990 | Takeda et al. | 257/303 |
| 5,548,149 | 8/1996 | Joyner | 257/350 |
| 5,691,564 | 11/1997 | Oyamatsu | 257/524 |

FOREIGN PATENT DOCUMENTS

| 62-35666 | 2/1987 | Japan | 257/653 |
| 63-237462 | 10/1988 | Japan. | |
| 2-116162 | 4/1990 | Japan. | |

*Primary Examiner*—Mark V. Prenty
*Attorney, Agent, or Firm*—Sughrue, Mion, Zinn Macpeak & Seas, PLLC

[57] ABSTRACT

The semiconductor memory device disclosed includes an element isolation insulating film, a first diffusion layer, a second diffusion layer. The first diffusion layer of a first conductivity type is buried inside the semiconductor substrate, and has an impurity concentration higher than that of the semiconductor substrate. The first diffusion layer is provided at a shallow position in the area where the element isolation insulating film is formed and is provided a deep position in the area where the element isolation insulating film is not formed. The second diffusion layer of a second conductivity type is at an area ranging from the surface of the semiconductor substrate to the first diffusion layer inside the semiconductor substrate. A p-n junction is formed at a junction portion between the first and second diffusion layers. The structure thus configured has a high resistance to soft errors.

19 Claims, 9 Drawing Sheets

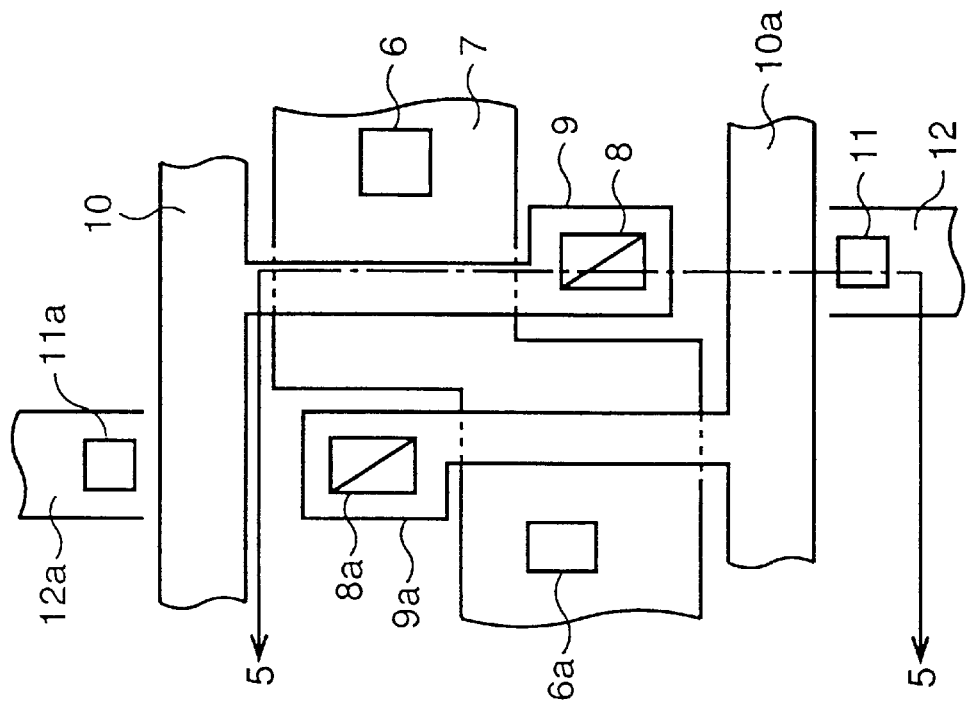
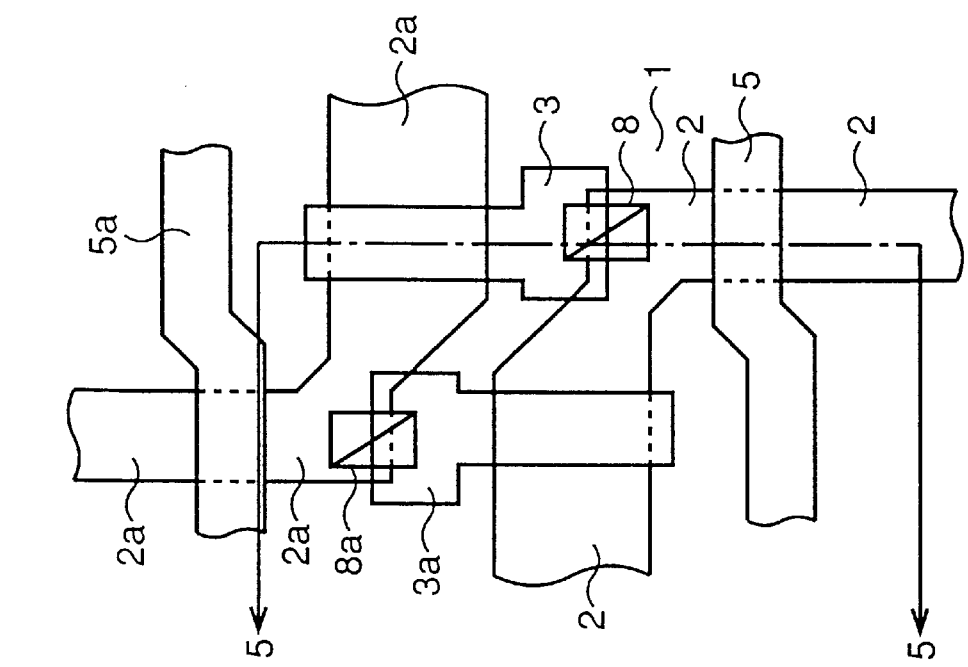

STATIC TYPE MEMORY CELL STRUCTURE WITH PARASITIC CAPACITOR

BACKGROUND OF THE INVENTION

(1) Field of the Invention

The present invention relates to a semiconductor device, and more particularly to a structure of a static type memory cell having a high resistance to soft errors.

(2) Description of the Related Art

Since the capacity of semiconductor memories is becoming large, the area of a static type memory cell is required to be as small as possible. From this viewpoint, memory cells have changed from CMOS type memory cells to resistor type memory cells. A CMOS type memory cell is constituted by a flip-flop made of p-channel and n-channel MOS transistors, whereas a resistor type memory cell (constituted by a flip-flop made of an n-channel transistor and a resistor) replaces a p-channel MOS transistor by a resistor to reduce the memory cell size. With recent technology advancement, a three-dimensional memory cell, that is, TFT (Thin Film Transistor) type memory cell is available which has a p-channel thin film transistor formed on an n-channel MOS transistor, and the memory cell size is further reduced. As compared to a resistor type memory cell, a TFT type memory cell requires a number of manufacturing processes. For this reason, TFT type memory cells and resistor type memory cells are selectively used depending on their application fields.

A resistor type memory cell will be described in the following as one example of conventional static type memory cells.

FIG. 1 is an equivalent circuit diagram of a static type memory cell. Resistor elements R1 and R2 of high resistance are used as load elements, and drive MOS transistors Q1 and Q2 are used as drive elements. One end of each resistor element is connected to a power source voltage Vcc, and the source of each drive MOS transistor is connected to a ground potential Vss. These resistor elements and drive transistors constitute a flip-flop circuit. Data is stored at information storage nodes N1 and N2 of the flip-flop circuit. Parasitic capacitors C1 and C2 are formed at the information storage nodes. For reading and writing data to and from the flip-flop circuit, the nodes are connected respectively to bit lines BL and BL' via transfer MOS transistors Q3 and Q4 to be selected by a word line WL.

The structure of such a conventional memory cell will be described with reference to FIGS. 2A, 2B, and 3. FIGS. 2A and 2B are plan views of a conventional memory cell. FIG. 2A is a plan view after drive and transfer MOS transistors are formed, and FIG. 2B is a plan view after resistor elements and bit lines are formed. FIG. 3 is a cross sectional view showing the vertical structure of this memory cell, the cross section being taken along line 3—3 of FIGS. 2A and 2B.

As shown in FIG. 2A, on the surface of a silicon substrate of a p-conductivity type or on the surface of a p-well formed in the silicon substrate, silicon active regions 102 and 102a are formed surrounded by an element isolation insulating film 101. Drive gate electrodes 103 and 103a for driving the drive MOS transistors are connected via buried contact holes 104 and 104a to the silicon active regions 102 and 102a. Word lines 105 and 105a are formed, the lines also serving as transfer gate electrodes for driving the transfer MOS transistors.

The source and drain regions of the drive and transfer MOS transistors are formed by implanting impurity ions such as arsenic ions into a region at which the gate electrodes are not formed in the silicon active regions. Thereafter, an interlayer insulating film is deposited covering the whole surface of the substrate. Ground contact holes 106 and 106a are formed in this interlayer insulating film as shown in FIG. 2B. The source regions of the drive transistors are electrically connected to a ground interconnect 107 via the contact holes.

Next, node contact holes 108 and 108a are formed as shown in FIGS. 2A and 2B. High resistance elements 109 and 109a are formed which are electrically connected to the drive gate electrodes 103 and 103a via the contact holes 108 and 108a. Interconnects 110 and 110a for applying a voltage to these high resistance elements 109 and 109a are also formed.

After bit line contact holes 111 and 111a are formed, bit lines 112 and 112a are formed to complete the structure of a conventional static type memory cell.

Methods of improving the resistance to soft errors have been proposed. These methods improve the resistance to soft errors by increasing the capacitance values of the parasitic capacitors C1 and C2 at the information storage nodes N1 and N2 of the memory cell having the structure described above. As one example of such methods, technology disclosed in Japanese Patent Application Kokai Publication No. Hei 2-116162 will be described with reference to the cross sectional structure of the memory cell shown in FIG. 3.

As shown in FIG. 3, a p$^+$-type buried layer 202 is formed on the surface of a p-type semiconductor substrate 201 at a predetermined region. A p-type epitaxial layer 203 is deposited thereon. Next, an element isolation insulating film 204 is formed on the surface of the p-type epitaxial layer 203 at a predetermined region.

Thereafter, a transfer transistor is formed having n$^+$-type diffusion layers 205 and 205a as its source/drain regions, a gate insulating film 206, and a transfer gate electrode 207. A drive gate electrode 208 is connected to the p-type epitaxial layer 203 via the buried contact hole, and an n$^+$-type diffusion region 209 is connected to the n$^+$-type diffusion region 205, reaching the p$^+$-type buried layer 202. Therefore, a p-n junction made of high concentration impurities is formed at the interface between the n$^+$-type diffusion region 209 and the p$^+$-type buried layer 202. This p-n junction increases the values of the parasitic capacitor C1 or C2.

Next, a first interlayer insulating film 210 and a ground interconnect 211 are formed, and a second interlayer insulating film 212 is deposited to cover them. A node contact hole 213 is then formed in the second interlayer insulating film 212 at a position preset for the drive gate electrode 208. A high resistance element 214 and a high resistance interconnect 214a are formed, which are connected to the drive gate electrode 208 via the node contact hole 213. A bit line 217 is formed connecting via a bit line contact hole 216 to the n$^+$-type diffusion layer 205a. In the above manner, the fundamental structure of a static type memory cell is formed.

A memory cell described above is associated, however, with the following disadvantages as the memory cell size is made small for aiming at large capacitance and high integration.

Uranium (U) or thorium (Th) contained in very small amount in ceramic material used for sealing a semiconductor device or interconnect material radiates α-rays when it decays. As α-rays are incident on a memory cell, electron-hole pairs are generated along the path of α-rays and mixed with charges stored in an information storage node. If a semiconductor element is so small that its memory data cannot be held, stored data is easily destroyed.

A conventional static type memory cell is designed to store charges sufficient for compensating for a loss of charges to be caused by α-rays, by the capacitance of the p-n junction between the n$^+$-type diffusion layer and p-type semiconductor substrate (or p-well) of a drain region of a MOS transistor and a dielectric capacitance of the gate insulating film. Another countermeasure for α-rays is to form a high impurity concentration buried layer just under a memory cell to thin a depletion layer and increase junction capacitance. However, these countermeasures become unsatisfactory in compensating for a loss of charges to be caused by α-rays if the memory cell area becomes small. As the memory cell structure becomes finer, a soft error rate increases and the reliability of semiconductor devices is considerably lowered.

According to the above-described technology of Japanese Patent Application Kokai Publication No. Hei 2-116162, a high impurity concentration buried layer is formed under a memory cell and connected to the drain diffusion layer of the drive MOS transistor. Therefore, since a diffusion region constituting the high impurity concentration buried layer and the p-n junction is formed, the parasitic capacitance at an information storage node of the memory cell is increased.

With this technology, although the resistance to soft errors can be improved to a certain degree, the manufacturing processes increase in number and becomes complicated because of the formation of a high impurity concentration buried layer. Furthermore, as the memory cell becomes finer, the area of the p-n junction reduces, thus making it difficult to secure sufficient parasitic capacitance.

SUMMARY OF THE INVENTION

It is an object of the present invention to provide the structure of a semiconductor element such as a memory cell excellent in its resistance to soft errors even if the size thereof becomes finer, and to provide a semiconductor device with high reliability.

According to one aspect of the present invention, there is provided a semiconductor device comprising:

an element isolation insulating film selectively formed on a semiconductor substrate of a first conductivity type;

a first diffusion layer of the first conductivity type buried inside the semiconductor substrate and having an impurity concentration higher than that of the semiconductor substrate and being formed such that the first diffusion layer provided in an area where the element isolation insulating film is at a shallow position and the first diffusion layer provided in an area where the element isolation insulating film is not formed is at a deep position; and a second diffusion layer of a second conductivity type formed at an area ranging from the surface of the semiconductor substrate to the first diffusion layer inside the semiconductor substrate, whereby a p-n junction diode element is formed at a junction portion between the first and second diffusion layers. The interface between the first and second diffusion layers includes a bottom and side walls of the second diffusion layer, the bottom constituting an interface formed between the first diffusion layer and the second diffusion layer at the deep position, and each of the side walls constituting an interface between the first diffusion layer and the second diffusion layer formed at a transition region from the shallow position to the deep position.

In the semiconductor device according to the invention, the high impurity concentration diffusion layer is formed in the whole surface area of the semiconductor substrate, the capacitor diffusion layer is formed in contact with the high impurity concentration diffusion layer, and the p-n junction is selectively formed at the predetermined area. The p-n junction is formed both laterally and vertically, that is, at both the bottom and side walls of the capacitor diffusion layer.

It is therefore easy to fabricate a semiconductor device having a high resistance to soft errors on a semiconductor substrate. In order to ensure this advantage of the invention, it is sufficient to add only a high energy ion implantation process to the manufacturing processes of the semiconductor device, dispensing with additional processes of photolithography, dry etching, and film forming. Accordingly, a semiconductor device with a high resistance to soft errors can be easily formed at low cost.

Still further, according to the present invention, the deep n-type diffusion layer is formed under the shared contact hole in a self-alignment manner so that leakage current otherwise caused by defects at edges of an element isolation insulating film will not be generated and a data storage performance can be improved significantly.

BRIEF DESCRIPTION OF THE DRAWINGS

The above and other objects, features and advantages of the present invention will be apparent from the following description of preferred embodiments of the invention explained with reference to the accompanying drawings, in which:

FIGS. 4A and 4B are plan views of a memory cell according to a first embodiment of the invention;

PREFERRED EMBODIMENTS OF THE INVENTION

Figure 1:
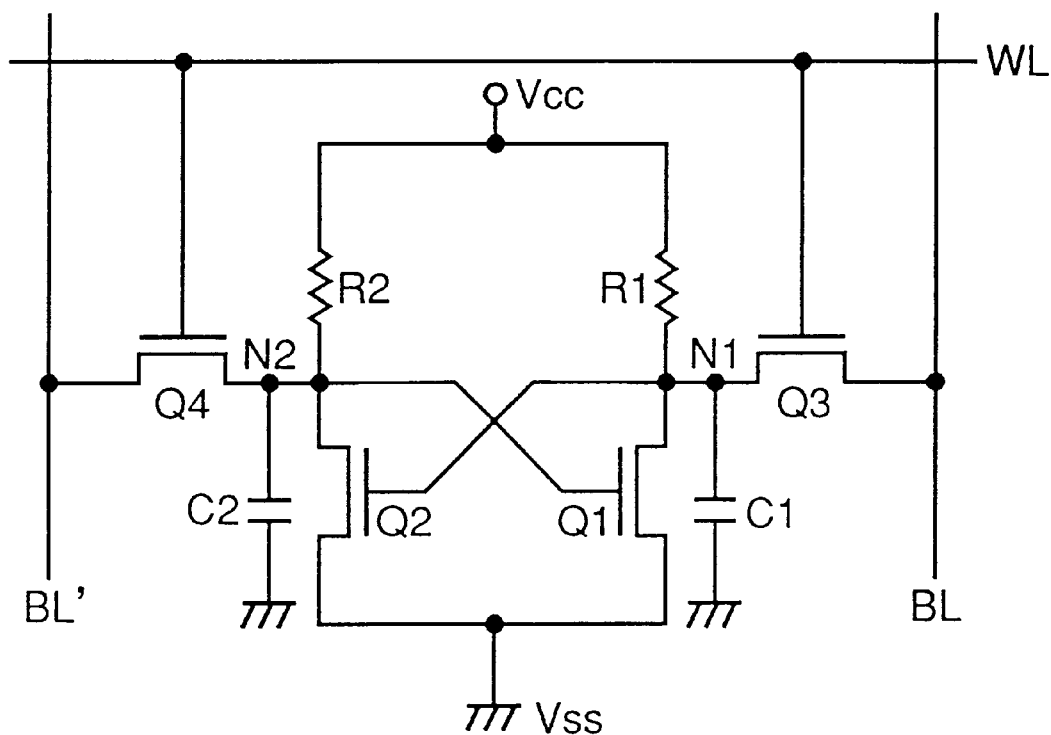
FIG. 1 is an equivalent circuit diagram of a conventional memory cell.
Figure 2B:
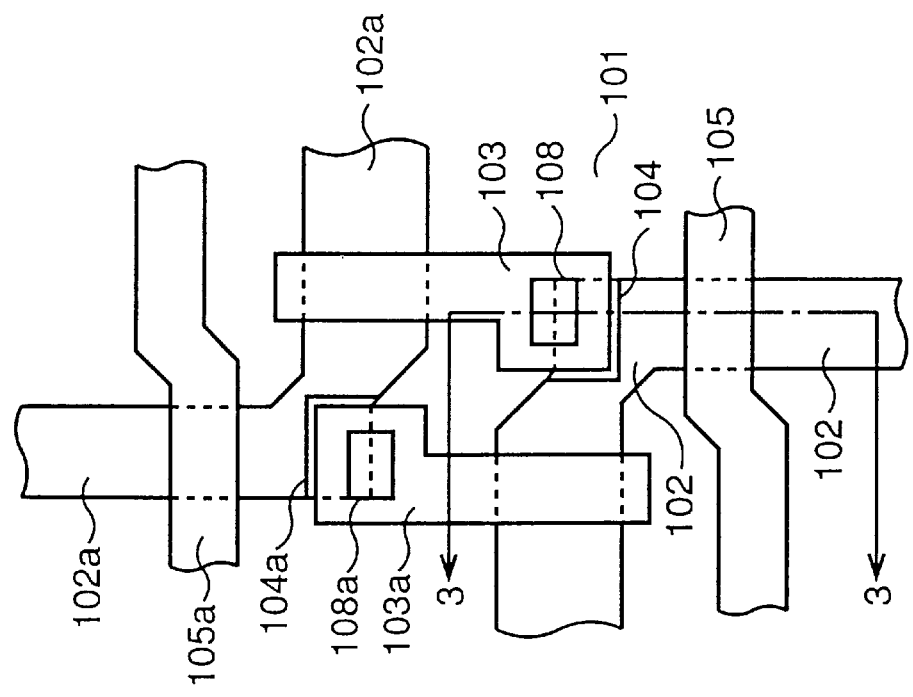
FIGS. 2A and 2B are plan views of a conventional memory cell.
Figure 2A:
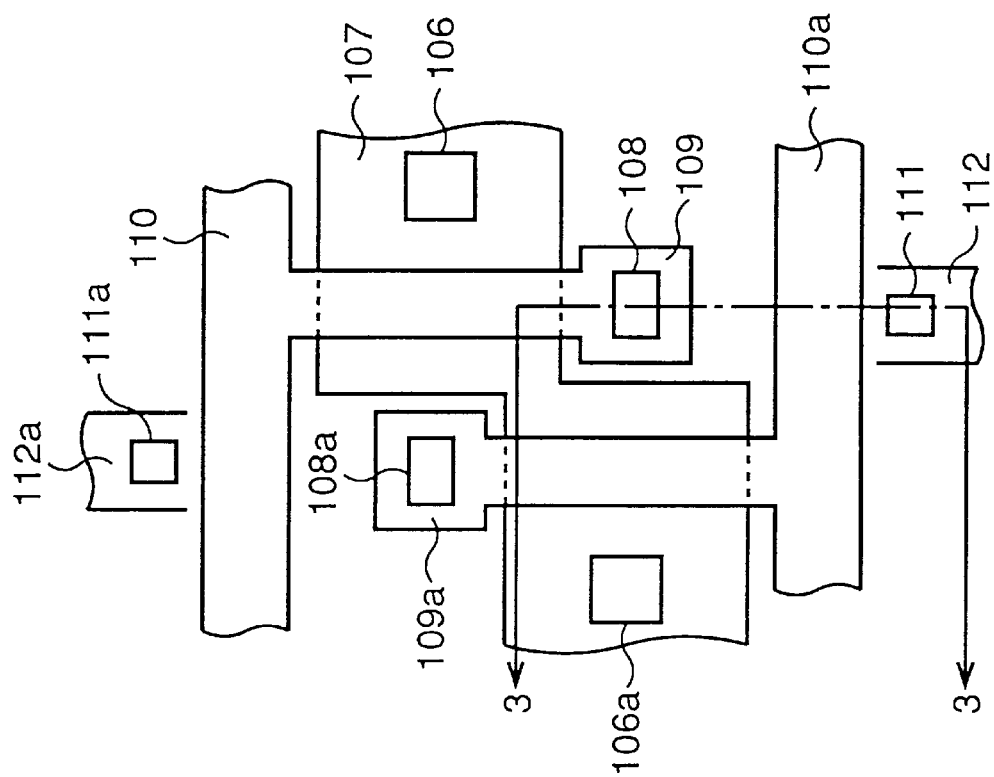
Figure 3:
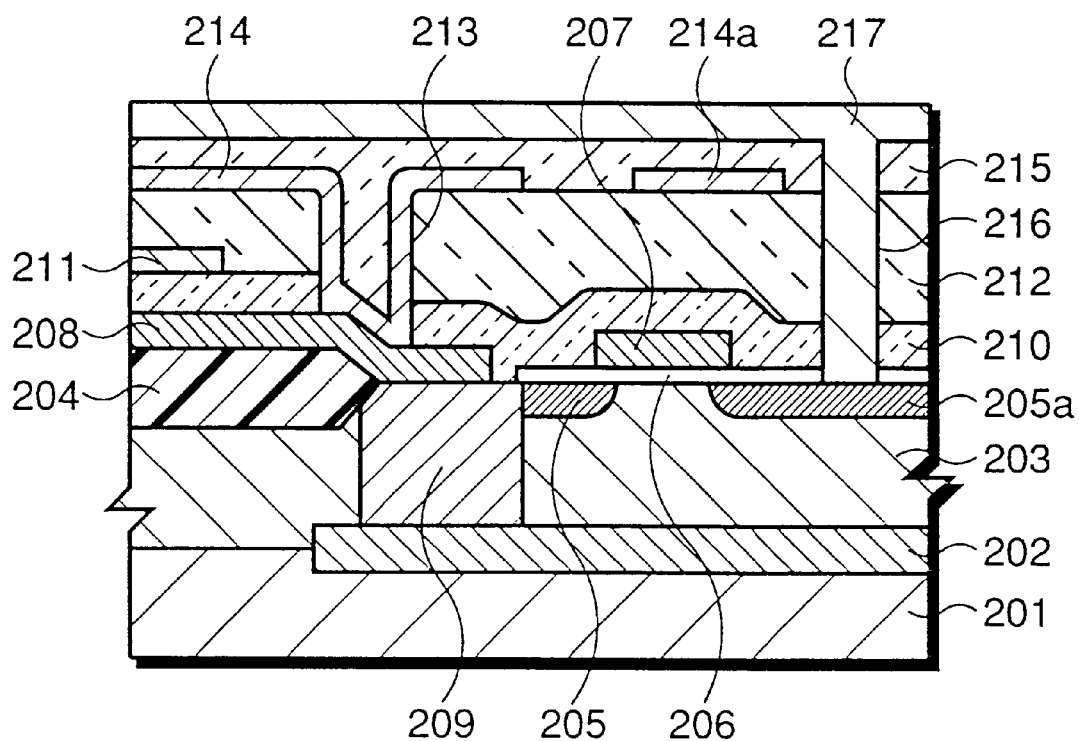
FIG. 3 is a cross sectional view of the conventional memory cell.
Figure 5:
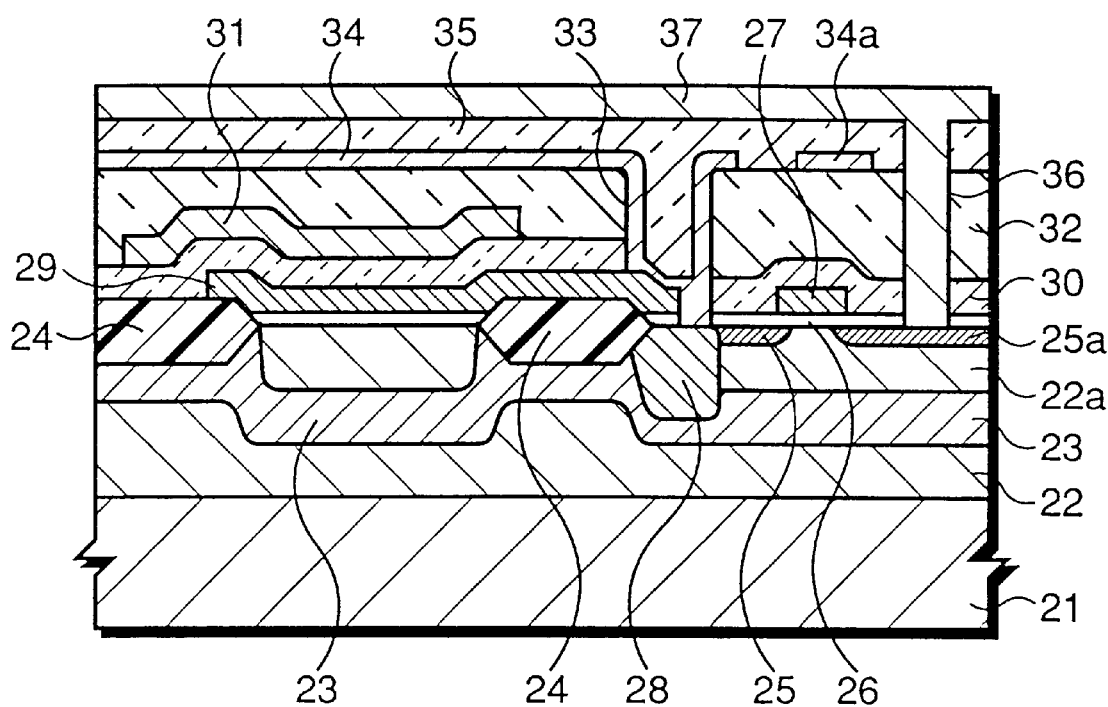
FIG. 5 is a cross sectional view of the memory cell of the first embodiment.

Now, embodiments of the present invention will be described with reference to the accompanying drawings. FIGS. 4A and 4B are plan views of a static type memory cell according to the first embodiment of the invention, and FIG. 5 is a cross sectional view of the memory cell of the embodiment, as taken along line 5—5 of FIGS. 4A and 4B.

As shown in FIG. 4A, on the surface of a silicon substrate of a p-conductivity type or on the surface of a p-well formed in the semiconductor substrate, silicon active regions 2 and 2a are formed being surrounded by an element isolation insulating film 1. Drive gate electrodes 3 and 3a for driving drive MOS transistors are formed. Word lines 5 and 5a are formed, the lines also serving as transfer gate electrodes for driving transfer MOS transistors.

The source and drain regions of the drive and transfer MOS transistors are formed by implanting impurity ions such as arsenic ions into a region at which the gate electrodes are not formed in the silicon active regions. Thereafter, an interlayer insulating film is deposited covering the whole surface of the substrate.

Next, as shown in FIG. 4B, ground contact holes 6 and 6a are formed in this interlayer insulating film. A ground interconnect 7 is formed which is electrically connected via the ground contact hole to the source region of the drive MOS transistor formed in the silicon active region 2a or 2. Another interlayer insulating film is deposited and shared contact holes 8 and 8a are formed therein. As shown in FIG. 4A, the shared contact hole 8 is formed above the drive gate electrode 3 and silicon active region 2, and the other shared contact hole 8a is formed above the drive gate electrode 3a and silicon active region 2a.

Next, a high resistance element 9 is formed which is electrically connected via the shared contact hole 8 to the drive gate electrode 3 and silicon active region 2, and a high resistance interconnect 10 for applying a voltage to the high resistance element 9 is formed. A high resistance element 9a and a high resistance element interconnect 10a for this element 9a are formed in the similar manner as above. The high resistance element 9a is electrically connected via the shared contact hole 8a to the drive gate electrode 3a and silicon active region 2a.

After bit line contact holes 11 and 11a are formed, bit lines 12 and 12a are formed to complete the structure of the memory cell of this embodiment.

Next, the embodiment of the invention will be described with reference to the cross sectional view of FIG. 5. A p-well 22 is formed on the surface of a silicon substrate 21 of an n-conductivity type. The impurity concentration of the p-well is $5 \times 10^{16}$ to $1 \times 10^{17}$ atoms/cm$^3$, and its depth is about 1 to 2 $\mu$m. A high impurity concentration p-type diffusion layer 23 is formed in the p-well 22. The depth of the center of the high impurity concentration p-type diffusion layer 23 is about 400 to 600 nm at the silicon active region, and the width of the region 23 is about 100 nm. In contrast, the depth of the high impurity concentration p-type diffusion layer is shallow under the region of the element isolation insulating film 24. A difference between these depths of the high impurity concentration p-type diffusion layer corresponds to about a film thickness of the element isolation insulating film. In the above manner, the p-well 22a where a semiconductor element is formed is surrounded by the high impurity concentration p-type diffusion layer 23.

The impurity concentration of the p-type diffusion layer 23 is set highest near at the center thereof, taking a value of $5 \times 10^{17}$ to $2 \times 10^{18}$ atoms/cm$^3$. Next, n$^+$-type diffusion layers 25 and 25a, a gate insulating film 26, and a transfer gate electrode 27 are formed to complete a transfer MOS transistor. In this case, a capacitor diffusion layer 28 electrically connected to the n$^+$-type diffusion layer 25 is formed. The conductivity type of the capacitor diffusion layer 28 is n-type and its impurity concentration is set to about $10^{18}$ to $10^{19}$ atoms/cm$^3$. The depth of the capacitor diffusion layer 28 is set to about 350 to 500 nm. In the above manner, a p-n junction is formed at an interface between the capacitor diffusion layer 28 and high impurity concentration p-type diffusion layer 23. The capacitor diffusion layer 28 is formed straddling over the area where the depth of the high impurity concentration p-type diffusion layer changes, i.e., on the boundary area between the element isolation insulating film 24 and silicon active region. Therefore, the p-n junction is formed both at the bottom and side walls of the capacitor diffusion layer 28.

Thereafter, a drive gate electrode 29, a first interlayer insulating film 30, a ground interconnect 31, and a second interlayer insulating film 32 are formed sequentially in this order. As shown in FIG. 5, a shared contact hole 33 is formed over the drive gate electrode 29 and capacitor diffusion layer 28, and a high resistance element 34 is formed being electrically connected via the shared contact hole 33 to the drive gate electrode 29 and capacitor diffusion layer 28. At this stage, a high resistance element interconnect 34a is formed.

Lastly, after a third interlayer insulating film 35 is formed and a bit line contact hole 36 is formed therein, a bit line 37 is formed to complete the fundamental structure of the memory cell of the embodiment.

According to the embodiment of the invention, a p-n junction between the capacitor diffusion layer 28 and the high impurity concentration p-type diffusion layer 23 is formed on the bottom and side walls of the capacitor diffusion layer 28 as a lateral and vertical structure. Therefore, a sufficient parasitic capacitance can be assured even if the memory size in plan becomes fine.

Figure 6:
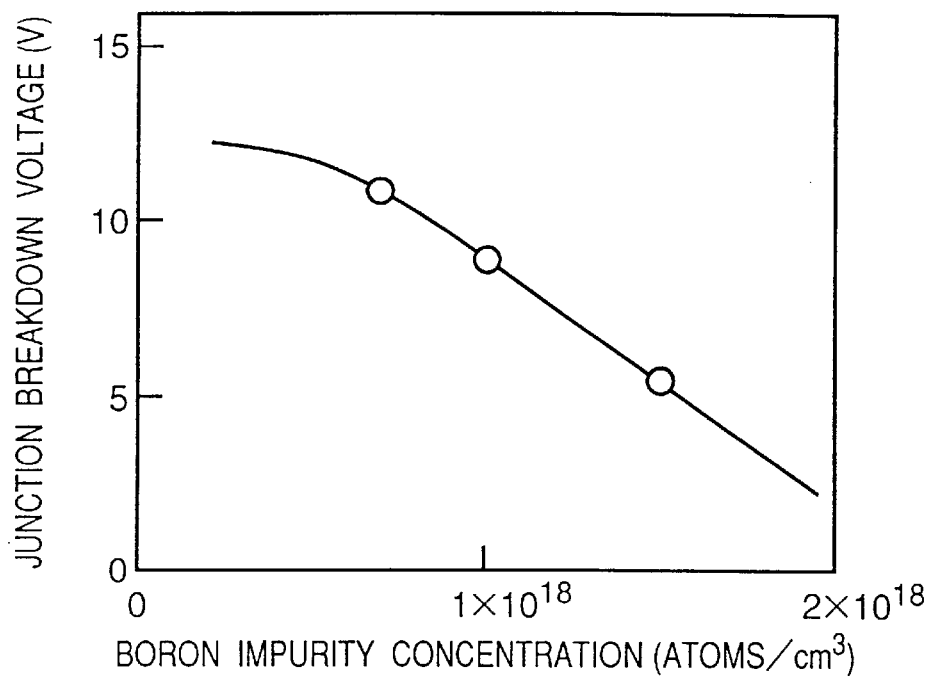
FIG. 6 is a graph showing a p-n junction breakdown voltage used for explaining the first embodiment.

The advantageous effects of the invention will be described with reference to FIGS. 6 and 7. As in the present invention, since the high impurity concentration p-n junction is formed including the lateral and vertical structure, the breakdown voltage of the p-n junction is easier to lower. FIG. 6 shows this junction breakdown voltage. The abscissa represents a boron impurity concentration in the high impurity concentration p-type diffusion layer 23 at the center thereof. The phosphorus impurity concentration in the capacitor diffusion layer 28 is generally uniform and takes a value of $1 \times 10^{18}$ atoms/cm$^3$.

As seen from FIG. 6, as the boron impurity concentration increases, the breakdown voltage of the p-n junction lowers. It is therefore necessary to set the impurity concentration which matches an operating voltage of a semiconductor device.

Figure 7:
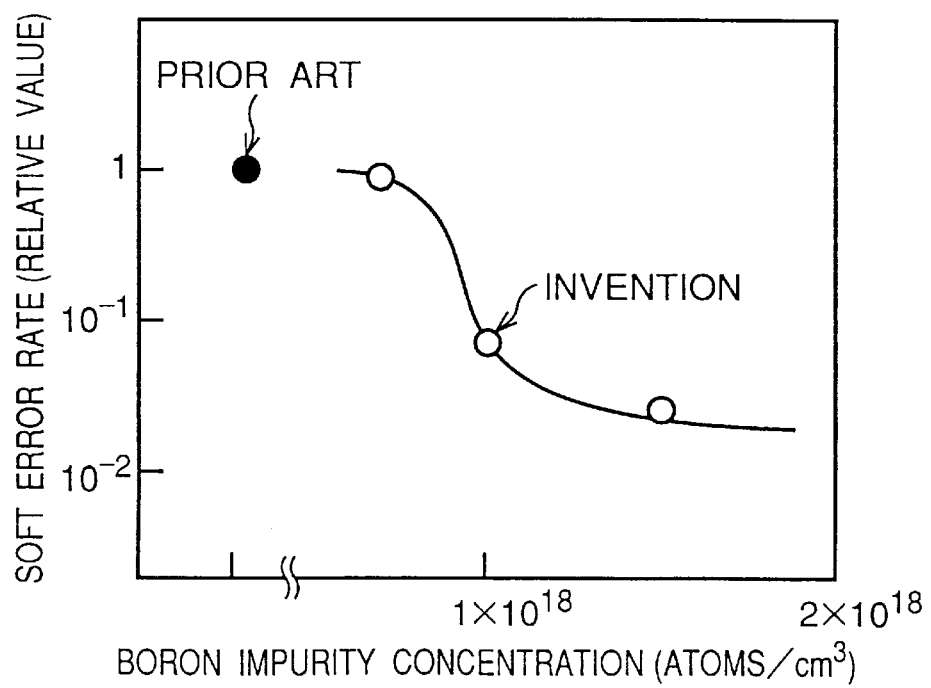
FIG. 7 is a graph showing a soft error rate used for explaining the first embodiment.

FIG. 7 shows a soft error rate of a static type memory having a capacity of 1 mega bits, each cell being formed with the p-n junction illustrated in FIG. 6. The soft error rate at the ordinate of the graph is a relative value using as a reference the soft error rate of the conventional technology disclosed in the previously cited Japanese Patent Application Kokai Publication No. Hei 2-116162. As seen from FIG. 7, according to the present invention, as the boron impurity concentration in the high impurity concentration p-type diffusion layer increases, the soft error rate lowers. At the boron impurity concentration increases to about $1.5 \times 10^{18}$ atoms/cm$^3$, the soft error rate lowers to about $1/30$ to $1/50$ of the conventional technology. At the higher concentration, the soft error rate does not change so much.

The reason that the memory cell structure of this invention improves the resistance to soft errors is ascribed to a sufficient parasitic capacitance stored at the information storage node, and also to the following effects. Specifically, with the memory cell structure of this invention, the silicon active region in which a MOS transistor is formed is completely surrounded by the high impurity concentration p-type diffusion layer 23 at its bottom and side wall portions.

The high impurity concentration p-type diffusion layer functions as a barrier of heat diffusion of electrons. Therefore, electrons generated by α-ray incidence are prevented from being diffused into the silicon active region, and the resistance to soft errors can be improved.

Figure 8A:
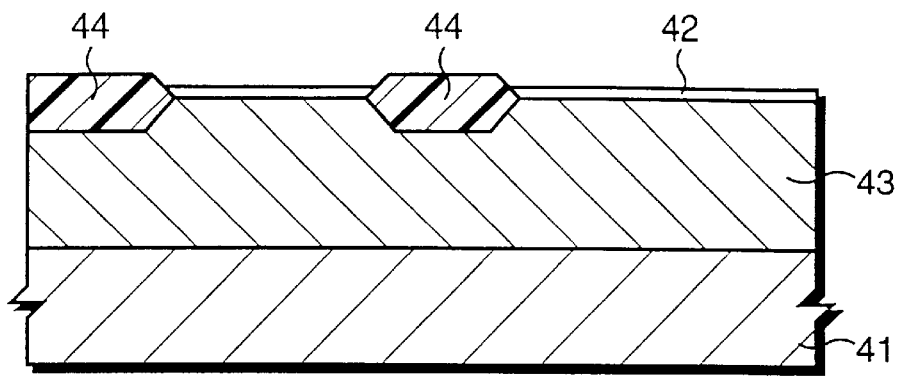
FIGS. 8A to 8E are cross sectional views illustrating the sequential processes of manufacturing a memory cell according to a first embodiment of the invention.

Next, a method for manufacturing a semiconductor device according to the invention will be described with reference to FIGS. 8A to 8E. FIGS. 8A to 8E are cross sectional views of the memory cell structure, illustrating the sequential processes of manufacturing the semiconductor device shown in FIG. 5. As shown in FIG. 8A, on the surface of a silicon substrate 41 of an n-conductivity type, a protective insulating film 42 of silicon oxide is formed to a thickness of about 20 nm. Next, boron impurity ions are implanted over the silicon substrate 41 which is then subjected to thermal treatment at a temperature of 1150° C. to form a p-well 43. The energy of ion implantation is 50 keV and a dose is about $5 \times 10^{12}$ ions/cm$^2$. Under these conditions, the depth of the p-well becomes about 2 μm and the impurity concentration thereof becomes about $5 \times 10^{18}$ atoms/cm$^3$.

Figure 8B:
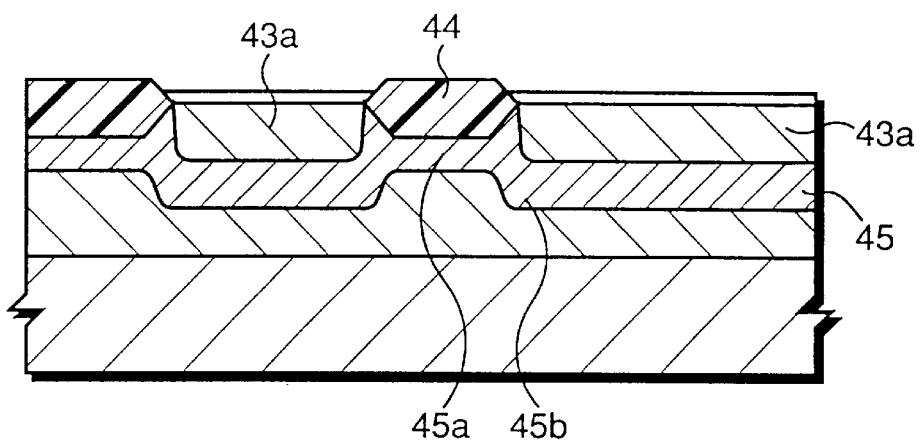

Thereafter, an element isolation insulating film 44 is selectively formed. This element isolation insulating film 44 is made of a silicon oxide film having a thickness of about 400 to 500 nm. Next, as shown in FIG. 8B, boron impurity ions are implanted by a high energy ion implantation process to form high impurity concentration p-type diffusion layers 45, 45a, and 45b, with the peak of an impurity distribution profile being set so as to be slightly under the element isolation insulating film 44. For example, if the element isolation nm thick, about 1m 44 is 400 nm thick, about 150 keV is suitable for the ion implantation energy. In the above manner, the high impurity concentration p-type diffusion layer 45 is formed in the region where a semiconductor element is later formed, the diffusion layer 45 having the impurity distribution profile peak at about a 400 nm depth. The high impurity concentration p-type diffusion layer 45a is formed under the element isolation insulating film 44, this layer 45a functioning as a channel stopper. The high impurity concentration p-type diffusion layer 45b becomes a transition region between the high impurity concentration p-type diffusion layer 45 formed at a deep position and the high impurity concentration p-type diffusion layer 45a formed at a shallow position, and constitutes a vertical structure.

With the above processes, p-wells 43a surrounded by the high impurity concentration p-type diffusion layers are formed as shown in FIG. 8B.

Figure 8C:
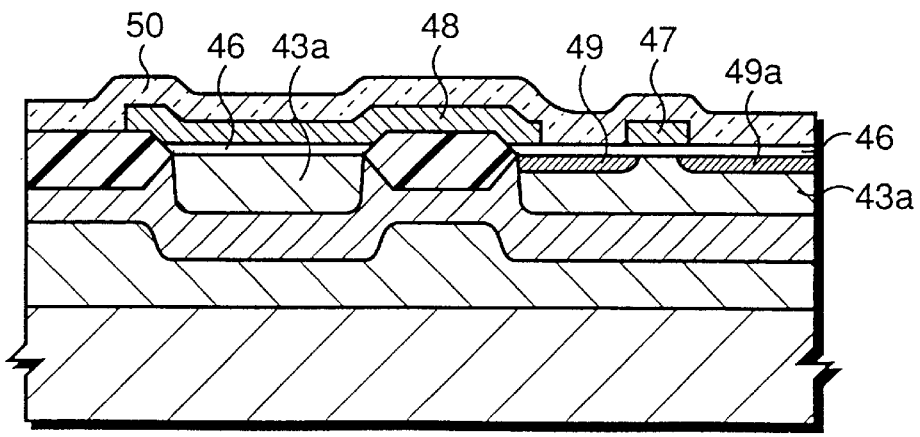

Next, as shown in FIG. 8C, a gate insulating film 46 is formed on which a transfer gate electrode 47 and a drive gate electrode 48 are formed. The gate insulating film 46 is made of a silicon oxide film having a thickness of about 10 nm. The gate electrodes are made of tungsten polycide deposited to a thickness of about 200 nm. By using the gate electrodes and element isolation insulating film as masks, arsenic impurity ions are implanted to form n$^+$-type diffusion layers 49 and 49a in the p-well 43a, the regions 49 and 49a forming the source and drain regions of a MOS transistor.

Next, a first interlayer insulating film 50 is deposited over the whole surface of the substrate. The first interlayer insulating film 50 is a silicon oxide film having a thickness of about 200 nm formed by a CVD (Chemical Vapor Deposition) process.

Figure 8D:
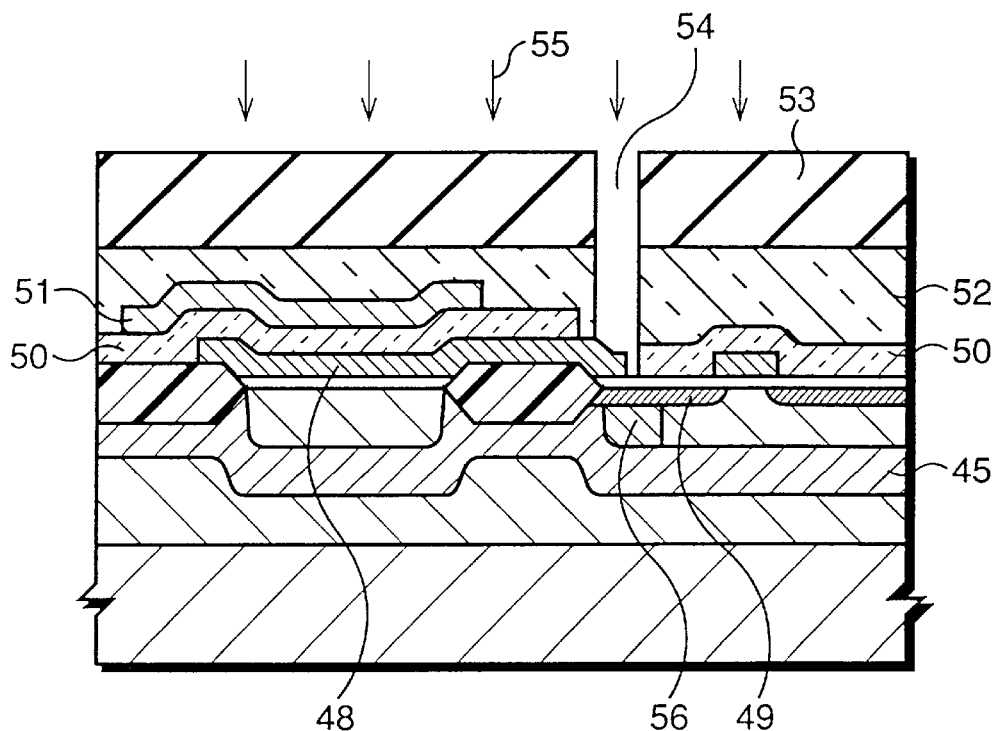

Next, as shown in FIG. 8D, a ground interconnect 51 is formed on the first interlayer insulating film 50. The ground interconnect 51 is a tungsten thin film having a thickness of about 150 nm. Thereafter, a second interlayer insulating film 52 is formed by CVD. The second interlayer insulating film 52 is a silicon oxide film having a thickness of about 400 nm and planarized by CMP (Chemical Mechanical Polishing).

Thereafter, a resist mask 53 is formed by well known photolithography. By using the resist mask 53 as an etching mask, the first and second interlayer insulating films 50 and 52 are dry etched to form a shared contact hole 54. This shared contact hole 54 is formed straddling over the drive gate electrode 48 and n$^+$-type diffusion layer 49. Also by using the resist mask 53 as an ion implantation mask, phosphorus impurity ions 55 are implanted at high energy deep into the silicon substrate to form a capacitor diffusion layer 56. The implantation energy is set to 300 keV, and the peak of a phosphorus ion distribution profile is set at a depth of about 380 nm from the substrate surface. Thus, the capacitor diffusion layer 56 comes to be in shared contact with the high impurity concentration p-type diffusion layer 45. It is important to select the implantation energy of phosphorus ions so as to cause the capacitor diffusion layer 56 to be in contact with the high impurity concentration p-type diffusion layer 45. The dose of phosphorus ions is set to about $5 \times 10^{15}$ ions/cm$^2$. In the above manner, the capacitor diffusion layer 56 is formed in self-alignment with the shared contact hole 54.

Figure 8E:
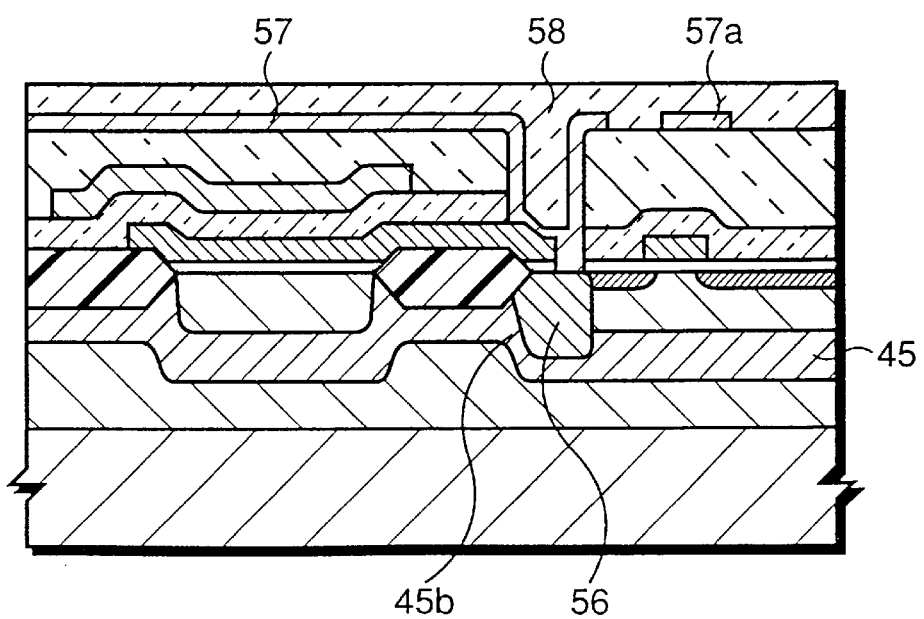

Next, as shown in FIG. 8E, after the resist mask 53 is removed, a high resistance element 57 and a high resistance interconnect 57a are formed. The high resistance element 57 is made of a polysilicon film of about 100 nm thick containing oxygen about 30 at. %. The high resistance interconnect 57a is formed by doping phosphorus ions in the high resistance element.

Thermal treatment is next performed at a temperature of about 800° C. for 30 minutes so as to recover crystallinity of the capacitor diffusion layer 56, and activate and thermally diffuse phosphorus impurity ions. In this manner, a p-n junction of good quality can be formed at the interface between the capacitor diffusion layer 56 and high impurity concentration p-type diffusion layer 45, 45b.

Next, a third interlayer insulating film 58 is deposited covering the whole surface of the substrate. Bit lines of aluminum or other metal are formed to complete the fundamental structure of a static type memory cell of this invention shown in FIG. 5.

Figure 9:
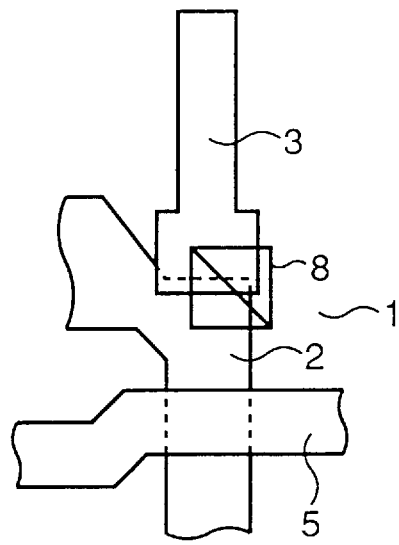
FIG. 9 is a plan view of a memory cell according to a second embodiment of the invention.
Figure 10:
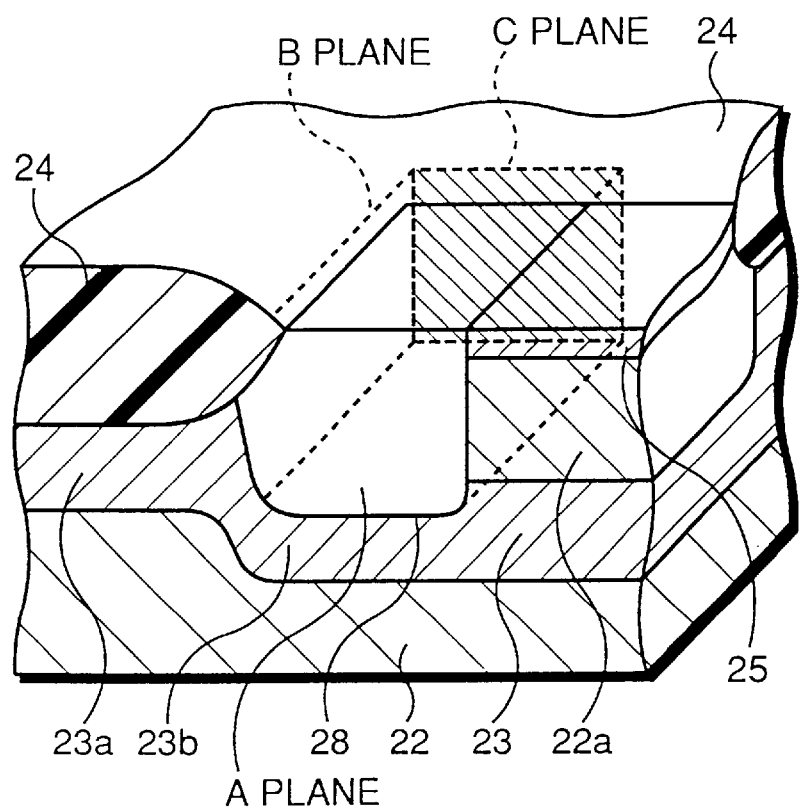
FIG. 10 is a perspective view partially in section showing the p-n junction region of the second embodiment.

Next, the second embodiment of the invention will be described with reference to FIGS. 9 and 10. FIG. 9 shows a partial plan view showing a static type memory cell like that shown in FIGS. 4A and 4B. FIG. 10 is a perspective view partially in section showing the region where the capacitor diffusion layer is formed. As different from the method of forming a shared contact hole of the first embodiment, the capacitor diffusion layer of the second embodiment is formed in a different manner and has a different structure. The other processes and structures are generally the same as the first embodiments. In FIGS. 9 and 10, like elements to those shown in FIGS. 4A, 4B, and 5 are represented by using identical reference numerals.

As shown in FIG. 9, after a silicon active region 2 surrounded by an element isolation insulating film 1 is formed, a drive gate electrode 3 and a word line 5 are formed. The word line 5 is also used as a transfer gate electrode. A shared contact hole is then formed which straddles over the silicon active region 2 and drive gate electrode 3 and also over the element isolation insulating film 1. The different points from the first embodiment reside in that the shared contact hole 8 has a size larger than the first embodiment and it straddles also over the element isolation insulating film 1.

The structure of the static type memory cell of the second embodiment is the same as the first embodiment, excepting the structure of the shared contact hole. The static type memory cell of the second embodiment can be fabricated by the manufacturing method described with FIGS. 8A to 8E.

As shown in FIG. 10, high impurity concentration p-type diffusion layers 23, 23a, and 23b are formed in a p-well 22 and a p-well 22a. As described earlier, the high impurity concentration p-type diffusion layer 23a under the element isolation insulating film 24 functions as a channel stopper. Formed thereafter are $n^+$-type diffusion layer 25 serving as the source and drain regions of a transfer MOS transistor. The $n^+$-type diffusion layer 25 shown in FIG. 10 is connected to a capacitor diffusion layer 28.

As described with FIG. 9, the shared contact hole 8 is formed straddling over the element isolation insulating film 24. Phosphorous impurity ions are implanted into the substrate through the shared contact hole in a self-alignment manner. Therefore, as shown in FIG. 10, a p-n junction between the capacitor diffusion layer 28 and high impurity concentration p-type diffusion layer 23 or 23b is constituted by planes A, B, and C. The plane A is a contact plane between the capacitor diffusion layer 28 and high impurity concentration p-type diffusion layer 23, and the planes B and C are contact planes between the capacitor diffusion layer 28 and high impurity concentration p-type diffusion layer 23b.

In contrast with the second embodiment, the first embodiment does not form the plane C. Furthermore, in the first embodiment, although depending upon the size of the shared contact hole, only the planes A and B smaller than those shown in FIG. 10 are formed.

Accordingly, in the second embodiment, the parasitic capacitance formed by the capacitor diffusion layer increases about 1.5 times as large as the first embodiment, under the same design criterion. The second embodiment is therefore more suitable for making a static type memory cell finer.

It is to be noted that static type memory cells of the above embodiments are applicable also to TFT type memory cells. In the above embodiments, as a semiconductor device, a static type memory cell is used by way of example. The basis of the constitution of this invention reside in that the semiconductor element is formed surrounded by a high impurity concentration diffusion layer and a diode element of a p-n junction is formed between a capacitor diffusion layer and high impurity concentration diffusion layer. Accordingly, similar advantageous effects of the invention can be obtained even for other semiconductor devices such as dynamic type memory cells, non-volatile memory cells, and semiconductor elements with other functions, without limiting only to static type memory cells. The conductivity type of the above embodiments may be reversed from p-type to n-type and vice versa.

What is claimed is:

1. A semiconductor memory device comprising:

an element isolation insulating film selectively formed on a semiconductor substrate of a first conductivity type so as to segregate said semiconductor substrate into an area where a semiconductor active device is later formed and an area covered by said element isolation insulating film;

a first diffusion layer of the first conductivity type buried inside said semiconductor substrate, coextensive with said area where said semiconductor active device is later formed and said area covered by said element isolation insulating film, and having an impurity concentration higher than that of said semiconductor substrate, said first diffusion layer being formed such that said first diffusion layer is provided at a shallow position in said area covered by said element isolation insulating film and such that said first diffusion layer is provided at a deep position in said area where said semiconductor active device is later formed; and a second diffusion layer of a second conductivity type formed at an area ranging from the surface of said semiconductor substrate to said first diffusion layer inside said semiconductor substrate, whereby a p-n junction diode element is formed at a junction portion between said first and second diffusion layers and a static type memory cell is formed in said area where a semiconductor active device is later formed, said static type memory cell including a first drive MOS FET and a first load element, wherein said second diffusion layer is formed in a region where a drain region of said first drive MOS FET and said first load element are electrically connected.

2. A semiconductor memory device comprising:

an element isolation insulating film selectively formed on a semiconductor substrate of a first conductivity type;

a first diffusion layer of the first conductivity type buried inside said semiconductor substrate and having an impurity concentration higher than that of said semiconductor substrate and being formed such that said first diffusion layer is provided at a shallow position in an area where said element isolation insulating film is formed and such that said first diffusion layer is provided at a deep position in an area where said element isolation insulating film is not formed; and a second diffusion layer of a second conductivity type formed at an area ranging from the surface of said semiconductor substrate to said first diffusion layer inside said semiconductor substrate;

whereby a p-n junction diode element is formed at a junction portion between said first and second diffusion layers;

said junction portion between said first and second diffusion layers including a bottom and side walls of said second diffusion layer, said bottom constituting an interface formed between said first diffusion layer and said second diffusion layer at said deep position, and each of said side walls constituting an interface between said first diffusion layer and said second diffusion layer formed at a transition region from said shallow position to said deep position.

3. A semiconductor memory device comprising:

an element isolation insulating film selectively formed on a semiconductor substrate of a first conductivity type so as to segregate said semiconductor substrate into an area where a semiconductor active device is later formed and an area covered by said element isolation insulating film;

a first diffusion layer of the first conductivity type buried inside said semiconductor substrate, coextensive with said area where said semiconductor active device is later formed and said area covered by said element isolation insulating film, and having an impurity concentration higher than that of said semiconductor substrate, said first diffusion layer being formed such that said first diffusion layer is provided at a shallow position in said area covered by said element isolation insulating film and such that said first diffusion layer is provided at a deep position in said area where said semiconductor active device is later formed;

a second diffusion layer of a second conductivity type formed at an area ranging from the surface of said semiconductor substrate to said first diffusion layer inside said semiconductor substrate, whereby a p-n junction diode element is formed at a junction portion between said first and second diffusion layers; and a static type memory cell including, in a region where said element isolation insulating film is not formed, a pair of data transfer MOS FETs, a pair of drive MOS FETs constituting a flip-flop circuit, and a pair of load elements formed at a higher layer level than said data transfer MOS FETs and said drive MOS FETs, said second diffusion layer being formed in a region where a drain region of said drive MOS FET and said load element are electrically connected.

4. A semiconductor memory device according to claim 3, which further comprises a shared contact hole for electrically connecting a drain region of one of said pair of drive MOS FETs and a gate electrode of the other of said pair of drive MOS FETs with a corresponding one of said load elements, said shared contact hole straddling over said drain region and said gate electrode, and said second diffusion layer being formed in self-alignment with said shared contact hole.

5. A semiconductor memory device according to claim 1, wherein said second diffusion layer contacts a side wall of said first diffusion layer.

6. A semiconductor memory device according to claim 5, wherein said first diffusion layer and said element isolation insulating film combine to form a barrier region which vertically and laterally surrounds said area where a semiconductor active device is later formed.

7. A semiconductor memory device according to claim 6, wherein a center of said first diffusion layer is about 400 to 600 nm from the surface of the semiconductor substrate in the area where a semiconductor active device is later formed.

8. A semiconductor memory device according to claim 7, wherein a width of said first diffusion layer is about 100 nm.

9. A semiconductor memory device according to claim 8, wherein said first diffusion layer is a p-type impurity and said second diffusion layer is an n-type impurity.

10. A semiconductor memory device according to claim 9, wherein a maximum impurity concentration of said first diffusion layer is in the range of about $5 \times 10^{17}$ to $2 \times 10^{18}$ atoms/cm$^3$.

11. A semiconductor memory device according to claim 10, wherein an impurity concentration of said second diffusion layer is in the range of about $1 \times 10^{18}$ to $1.5 \times 10^{18}$ atoms/cm$^3$.

12. A semiconductor memory device according to claim 11, wherein said second diffusion layer contacts a top surface of said first diffusion layer.

13. A semiconductor memory device according to claim 12, whereby said first diffusion layer provides a barrier of heat diffusion of electrons and prevents incident alpha-rays from being diffused into said area where a semiconductor active device is later formed.

14. A semiconductor memory device according to claim 13, which further comprises in said static type memory cell:

a pair of data transfer MOS FETs, a pair of drive MOS FETs, including said first drive MOS FET and a second drive MOS FET, constituting a flip-flop circuit, and a pair of load elements, including said first load element and a second load element, formed at a higher layer level than said data transfer MOS FETs and said drive MOS FETs.

15. A semiconductor memory device according to claim 14, which further comprises a shared contact hole for electrically connecting a drain region of one of said pair of drive MOS FETs and a gate electrode of the other of said pair of drive MOS FETs with a corresponding one of said load elements, said shared contact hole straddling over said drain region and said gate electrode, and said second diffusion layer being formed in self-alignment with said shared contact hole.

16. A semiconductor memory device comprising:

an element isolation insulating film selectively formed on a semiconductor substrate of a first conductivity type so as to segregate said semiconductor substrate into an area where a semiconductor active device is later formed and an area covered by said element isolation insulating film;

a first diffusion layer of the first conductivity type buried inside said semiconductor substrate, coextensive with said area where said semiconductor active device is later formed and said area covered by said element isolation insulating film, and having an impurity concentration higher than that of said semiconductor substrate, said first diffusion layer being formed such that said first diffusion layer is provided at a shallow position in said area covered by said element isolation insulating film and such that said first diffusion layer is provided at a deep position in said area where said semiconductor active device is later formed; and a second diffusion layer of a second conductivity type formed at an area ranging from the surface of said semiconductor substrate to said first diffusion layer inside said semiconductor substrate and wherein said second diffusion layer contacts a plurality of side walls of said first diffusion layer, whereby a p-n junction diode element is formed at a junction portion between said first and second diffusion layers.

17. A semiconductor memory device according to claim 16, wherein said second diffusion layer contacts a top surface of said first diffusion layer.

18. A semiconductor memory device according to claim 17, which further comprises:

a static type memory cell including, in said area where a semiconductor active device is later formed, a pair of data transfer MOS FETs, a pair of drive MOS FETs constituting a flip-flop circuit, and a pair of load elements formed at a higher layer level than said data transfer MOS FETs and said drive MOS FETs, said second diffusion layer being formed in a region where a drain region of said drive MOS FET and said load element are electrically connected.

19. A semiconductor memory device according to claim 18, which further comprises a shared contact hole for electrically connecting a drain region of one of said pair of drive MOS FETs and a gate electrode of the other of said pair of drive MOS FETs with a corresponding one of said load elements, said shared contact hole straddling over said drain region and said gate electrode, and said second diffusion layer being formed in self-alignment with said shared contact hole.

* * * * *